United States Patent [19]

Miyagi et al.

[11] Patent Number: 5,506,755
[45] Date of Patent: Apr. 9, 1996

[54] MULTI-LAYER SUBSTRATE

[75] Inventors: Takeshi Miyagi, Fujisawa; Kazuhiro Matsumoto; Tomiya Sasaki, both of Yokohama; Hideo Iwasaki, Kawasaki; Katsumi Hisano, Yokohama, all of Japan

[73] Assignee: Kabushiki Kaisha Toshiba, Kanagawa, Japan

[21] Appl. No.: 291,508

[22] Filed: Aug. 18, 1994

Related U.S. Application Data

[63] Continuation of Ser. No. 29,656, Mar. 10, 1993, abandoned.

[30] Foreign Application Priority Data

Mar. 11, 1992 [JP] Japan .................................. 4-052865
Mar. 26, 1992 [JP] Japan .................................. 4-068009

[51] Int. Cl.⁶ ........................................................ H05K 7/20
[52] U.S. Cl. .......................... 361/720; 174/252; 257/712; 257/723; 361/792
[58] Field of Search .................................. 174/16.3, 252; 257/706–707, 712, 717, 723–724; 361/704, 707, 712, 717–723, 778, 792–794

[56] References Cited

U.S. PATENT DOCUMENTS 4,739,448  4/1988  Rowe et al. ........................... 361/386
4,855,537  8/1989  Nakai et al. ........................... 174/68.5

FOREIGN PATENT DOCUMENTS 55-53446   4/1980  Japan ................................ 361/386
307768    12/1988  Japan ................................ 361/386
303745     7/1989  Japan ................................ 361/386

Primary Examiner—Gregory D. Thompson
Attorney, Agent, or Firm—Finnegan, Henderson, Farabow, Garrett & Dunner

[57] ABSTRACT

A multi-layer wiring substrate includes an aluminum nitride ceramic substrate, a multi-layer wiring part having an electric insulating layer of an organic polymer, a die pad for mounting thereon an electronic part, and a thermal via of a column shape for effectively dissipating heat generated in the mounted electric part. The multi-layer wiring part is integrally formed on the ceramic substrate. The die pad is provided on a surface of the multi-layer wiring part. One end of the thermal via connects to the die pad, while the other end of the thermal via passes through the multi-layer wiring part and extends at least to the ceramic substrate. The thermal via is electrically insulated from the multi-layer wiring part. In the second multi-layer wiring substrate, at least one of end portions of the above thermal via is wider than a section of the other portion of the thermal via, resulting in further improvement of the heat dissipating property.

11 Claims, 5 Drawing Sheets

MULTI-LAYER SUBSTRATE

This application is a continuation, of application Ser. No. 08/029,656, filed Mar. 10, 1993, now abandoned.

BACKGROUND OF THE INVENTION

1. Field of the Invention

The present invention relates to a multi-layer wiring substrate and, more particularly, to a multi-layer wiring substrate suitable for mounting thereon semiconductive elements and the like which operate at a high speed and generate a large amount of heat.

2. Description of the Related Art

Recently, high speed operations are required not only for super computers, but also for general computers. For this requirement, conventional devices such as a CMOS, which serve as a semiconductive element (LSI and the like), have been improved to operate at a high speed. At the same time, new devices represented by an ECL or GaAs have also been developed. In order that these very high speed elements operate at their inherent high speeds, a wiring substrate of a new structure or new mounting system is required. As means for satisfying such requirements, the following multi-layer wiring substrate has been developed. This multi-layer wiring substrate is formed integrally with a thin-film multi-layer wiring part wherein insulative layers of, e.g., polyimide resin and conductive patterns of copper type are alternately laminated on a predetermined surface of a Si substrate or multi-layer ceramic wiring substrate. In this multi-layer wiring substrate, a high speed semiconductive element is mounted on a die pad provided on the surface of the thin-film multi-layer wiring part and it is electrically connected to the thin-film multi-layer wiring part. Further, the thin-film multi-layer wiring part or semiconductive element are integrally sealed and secured by, e.g., a metal cap to be packaged. In the above-mentioned multi-layer wiring substrate, polyimide resin, whose dielectric constant is as small as about 3, is used as an insulating layer of the thin-film multi-layer wiring part. As a result, the propagation delay time of signals can be reduced and a circuit formed by using the multi-layer wiring substrate can operate at a high speed with the excellent properties.

However, the above multi-layer wiring substrate has the following problems. Namely, a multi-layer wiring substrate, on which a very high speed element such as a CMOS is mounted, is demanded to have further excellent electric property for high speed signals, and further preferable heat dissipation property for large heat generation. A structure of a thin-film multi-layer wiring with polyimide resin type insulating layers and copper type conductive pattern layers is proposed for the demand of high speed signals. A structure that a heat radiating fin is disposed on the back surface of a package is proposed for the demand of the heat dissipation property. However, the above structure of the multi-layer wiring substrate or mounting structure cannot sufficiently dissipate heat generated during operations at high speeds. That is, a very high speed element such as a CMOS generates heat of about several tens of W during high speed operations. On the other hand, the thickness of 10 to 30 μm per layer is required for a polyimide resin type insulating layer, which constitutes a thin-film multi-layer wiring, to reduce the capacity of a signal line and to control the characteristic impedance. In the case of a multi-layer wiring substrate, the total thickness exceeds 100 μm. Since the thermal conductivity of polyimide resin is low, the thermal resistance becomes large. Accordingly, heat generated during high speed operations of the very high speed element is not sufficiently dissipated, resulting in that the inherent functions of the very high speed element cannot be effected.

Further, a metal column (thermal via), which is arranged from a die pad through a multi-layer wiring layer to a substrate so as to promote heat dissipation during operations of an element, has been investigated. However, this cannot provide sufficient effects in dissipating heat generated during high speed operations of the very high speed element.

SUMMARY OF THE INVENTION

An object of the present invention is to provide a multi-layer wiring substrate exhibiting excellent electric and thermal properties even when a device, which generates a large amount of heat, such as a high speed CMOS device, ECL device and GaAs device is mounted.

The first aspect of this invention is a multi-layer wiring substrate comprising; a ceramic multi-layer wiring substrate having an electric insulating layer of aluminum nitride; a thin-film multi-layer wiring part having an electric insulating layer of an organic polymer, the thin-film multi-layer wiring part being integrally formed on a first surface of the ceramic multi-layer wiring substrate; a die pad for mounting thereon an electronic part, the die pad being provided on a surface of the thin-film multi-layer wiring part; at least one thermal via, one end of the thermal via being connected to the die pad, the other end of the thermal via passing through the thin-film multi-layer wiring part and extending to at least a surface of the ceramic multi-layer wiring substrate, the thermal via being electrically insulated from the thin-film multi-layer wiring part; and a heat radiating fin, being provided on a surface opposite to the first surface of the ceramic multi-layer wiring substrate.

The second aspect of this invention is a multi-layer wiring substrate comprising; a ceramic substrate; a wiring layer comprising a wiring formed in an electrical insulating material, the wiring layer being integrally formed on the ceramic substrate; a die pad for mounting thereon a mounted part, the die pad being provided on a surface of the wiring layer; and a thermal via of a column shape for transferring heat, the thermal via being provided in the wiring layer so as to pass through at least the wiring layer in a direction of a wiring layer thickness and contact the substrate and the die pad; wherein at least one of end portions of the thermal via which contact the substrate and the die pad is wider than a section of the other portion of the thermal via.

The third aspect of this invention is a multi-layer wiring substrate comprising; a ceramic substrate; a wiring layer comprising a wiring formed in an electrical insulating material, the wiring layer being integrally formed on the ceramic substrate; a die pad for mounting thereon a mounted part, the die pad being provided on a surface of the wiring layer; and a thermal via of a column shape for transferring heat, the thermal via being provided in the wiring layer so as to pass through at least the wiring layer in a direction of a wiring layer thickness and contact the substrate and the die pad; wherein a sectional area of a end portion of the thermal via is larger than an average sectional area, and satisfies the following equation;

$$0.045 < A^* < 0.19 h^* + 0.34$$
$$A^* = (d_e/D)^2$$
$$h^* = h/d$$

3
-continued $$h = \frac{L}{2} \frac{(d_{av})^2 - d^2}{(d_e)^2 - d^2}$$

wherein
- d: when a square, which has the same area as the sectional area of the smallest portions of the thermal via, is assumed, d is the length of one side of the square;
- $d_e$: when a square, which has the same area as the area of the end portion of the thermal via contacting the die pad or substrate, is assumed, $d_e$ is the length of one side of the square;
- $d_{av}$: when a square, which has the same area as the average area of the sectional portions of the thermal via, is assumed, $d_{av}$ is the length of one side of the square;
- D: the average pitch of the thermal via contacting the die pad;
- L: the length of the thermal via.
- h: the length of the portion of the thermal via having $d_e$

4
DESCRIPTION OF THE PREFERRED EMBODIMENTS

The multi-layer wiring substrate of the present invention will now be described in more detail.

Figure 1:
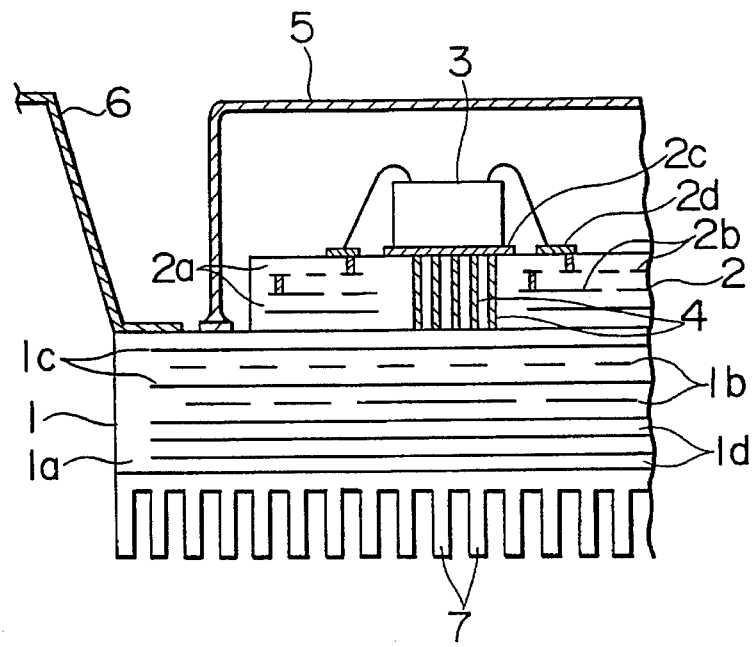
FIG. 1 is a sectional view of the main structure of a hybrid integrated circuit device using a multi-layer wiring substrate according to the present invention.
Figure 2:
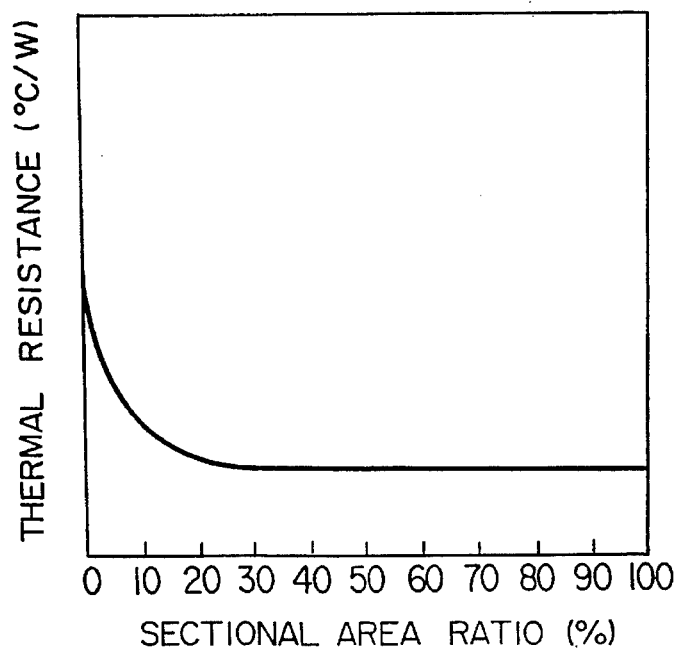
FIG. 2 is a diagram illustrating the relationship between the thermal resistance and the sectional area ratio of a thermal via which is arranged through a thin-film multi-layer wiring part in a multi-layer wiring substrate according to the present invention.

The first multi-layer wiring substrate of the present invention comprises a ceramic multi-layer wiring substrate where aluminum nitride is used as an insulating layer, a thin-film multi-layer wiring part where an organic polymer is used as an insulating layer, and a thermal via which is arranged at least through the thin-film multi-layer wiring part and is electrically insulated from the thin-film multi-layer wiring. One or a plurality of the thermal vias may be arranged through the thin-film multi-layer wiring part. Further, all the area of a part where the thermal via contacts the surface of a die-pad is preferably ranged from about 5 to about 20% of all the area of the die pad surface. For example, FIG. 2 shows the relationship between the ratio of all the area of a part in where the thermal via contacts with the surface of a die-pad to all the area of the die pad as 100 (area ratio %); and the thermal resistance (°C./W) in an experiment using the multilayer wiring substrate as shown in FIG. 1. As is apparent from FIG. 2, if the area ratio exceeds 5%, the thermal resistance is considerably decreased. If the area ratio exceeds about 20%, the thermal resistance becomes saturated and hardly changes. The reason for this is why if the area ratio exceeds about 20%, wiring design of the thin-film multi-layer part is limited. Further, the thermal via may be constructed such that the thermal via passes through the thin-film multi-layer wiring part, and the ceramic multi-layer wiring substrate; and comes in electric contact with a ground layer disposed in the ceramic multi-layer wiring substrate as an inner layer, or a heat radiating fin disposed on the back surface of the ceramic multi-layer wiring substrate.

As described above, the first multi-layer wiring substrate of the present invention comprises a ceramic multi-layer wiring substrate where aluminum nitride with the high thermal conductivity is used as an insulating layer, a thin-film multi-layer wiring part where an organic polymer is used as an insulating layer for high speed signals, and a thermal via which is arranged at least through the thin-film multi-layer wiring part and is electrically insulated from the thin-film multi-layer wiring. Thus, high speed signals of an electric part which operate at a high speed is readily and securely processed by the thin-film multi-layer wiring part. The amount of generated heat caused by high speed operations is thermally conducted through the thermal via to the side of aluminum nitride with the high thermal conductivity. As a result, the heat is readily dissipated so that high speed CMOS devices, ECL devices, GaAs devices and the like to be mounted can stably perform desired operations. Namely, an electric circuit device of a high speed operative type with the high reliability can be constructed.

Next, referring to FIGS. 1 and 3, an embodiment of the first multi-layer wiring substrate according to this invention will be described.

Embodiment 1

FIG. 1 is a sectional view illustrating a main structure of a hybrid integrated circuit using a multi-layer wiring substrate of this invention. Numeral 1 denotes an aluminum nitride multi-layer wiring substrate. The aluminum nitride multi-layer wiring substrate 1 contains therein an aluminum nitride layer as an interlayer insulator 1a, a desired signal wiring layer 1b, a power source wiring layer 1c, and a parallel plate capacitor 1d constituting a decoupling capacitor. Numeral 2 denotes a thin-film multi-layer wiring part formed integrally on the surface of the aluminum nitride multi-layer wiring substrate 1. Interlayer insulating layers 2a made of polyimide resin, and signal wiring layers 2b are integrally and alternately laminated to form the thin-film multi-layer wiring part 2. The signal wiring layer 2b is formed of, for example, Au, Cu, Al, Cr, Ni, Ti, W, and Mo. As the interlayer insulating layer 2a, the other polyimide type resins such as polyamide resin, polyamideimide resin, and pentacyclobutane resin may be used instead of the above polyimide resin.

Particular consideration is taken into the structure of the thin-film multi-layer wiring part 2. That is, single or a plurality of metal columns (thermal vias) 4 are arranged through the thin-film multi-layer wiring part such that one end of the thermal via is connected to the surface (die pad) 2c on which a desired electronic part 3, e.g., a LSI element, is mounted. The thermal-via 4 is electrically insulated from the signal wiring layer 2b contained in the thin-film multi-layer wiring part 2. The other end of the thermal via 4 is connected to the surface of the aluminum nitride multi-layer wiring substrate 1. The electric part 3, which is mounted on the die pad surface 2c of the thin-film multi-layer wiring part 2, is bonded by a wire to a bonding pad 2d on the surface of the thin-film multi-layer wiring part 2. The thin-film multi-layer wiring part 2 is secured and sealed on the surface of the aluminum nitride multi-layer wiring substrate 1 by a metal cap 5 and the like. Accordingly, a hybrid integrated circuit device is constructed. In FIG. 1, numeral 6 donates an input/output lead, numeral 7 a heat radiating fin.

The above multi-layer wiring substrate of this invention is manufactured in the following manner. First, a desired wiring pattern is printed on the surface of an aluminum nitride green sheet using a conductive paste such as W and Mo. Several sheets of such green sheets are piled up and laminated to be subject to sintering at the same time. Thereafter, one, or two or more metals selected from, e.g., Au, Cu, Al, Cr, Ni, Ti, and W are deposited on the main surface of the multi-layer sintering body by vacuum deposition and sputtering. The resultant multi-layer sintering body is patterned by photolithography technique to form the aluminum nitride multi-layer wiring substrate 1.

Next, polyimide resin is spin-coated and prebaked on the surface of the aluminum nitride multi-layer wiring substrate 1 thus formed. Sequentially, a contact hole is formed in the polyimide resin and then the polyimide resin is cured. Thereafter, for example, Cu or Ni is precipitated by a plating method in the contact hole to form a part of the thermal via 4. While the contact hole is filled, the desired signal wiring layers 2b are formed on the surface of the cured polyimide resin layer (interlayer insulative layer) 2a. These sequent processes are repeated to form the thin-film multi-layer wiring part 2 having desired multi-layer wiring layers. As a result, the multi-layer wiring substrate, which have the aluminum nitride multi-layer wiring substrate 1 and thin-film multi-layer wiring part 2 containing the thermal via 4 therein, is obtained.

Embodiment 2

Figure 3:
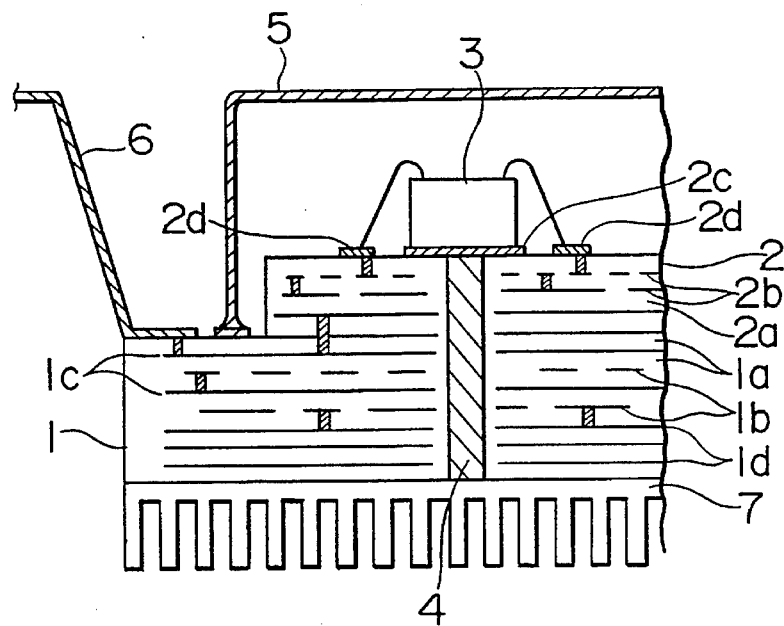
FIG. 3 is a sectional view of the main structure of a hybrid integrated circuit device using the other multi-layer wiring substrate according to the present invention.

FIG. 3 is a sectional view illustrating a main structure of a hybrid integrated circuit using another multi-layer wiring substrate of this invention. Similarly to the embodiment 1, numeral 1 denotes an aluminum nitride multi-layer wiring substrate. The aluminum nitride multi-layer wiring substrate contains therein an aluminum nitride layer as an interlayer insulator 1a, a desired signal wiring layer 1b, a power source wiring layer 1c, and a parallel plate capacitor 1d, constituting a decoupling capacitor. Numeral 2 denotes a thin-film multi-layer wiring part formed integrally on the surface of the aluminum nitride multi-layer wiring substrate 1. Interlayer insulating layers 2a made of polyimide resin, and signal wiring layers 2b are integrally and alternately laminated to form the thin-film multi-layer wiring part 2.

In this embodiment, particular consideration is taken into the structures of the aluminum nitride multi-layer wiring substrate 1 and the thin-film multi-layer wiring part 2. That is, single or a plurality of thermal vias 4 are arranged such that one end of the thermal via is connected to the surface (die pad) 2c on which a desired electronic part 3, e.g., a LSI element, is mounted. The thermal-via 4 is electrically insulated from the signal wiring layer 2b contained in the thin-film multi-layer wiring part 2; and the signal wiring layer 1b and power source wiring layer 1c contained in the aluminum nitride multi-layer wiring substrate 1. The other end of the thermal via 4 is connected to a heat radiating fin 7 disposed on the back surface of the aluminum nitride multi-layer wiring substrate 1. In other words, as compared with the embodiment 1, the difference from the structure thereof is that the thermal via is arranged through both the aluminum nitride multi-layer wiring substrate 1 and the thin-film multi-layer wiring part 2. In the case of this structure, by connecting the thermal via 4 to the power source layer 1c contained in the aluminum nitride multi-layer wiring substrate 1 and heat radiating fin 7, the thermal via 4 contributes not only to heat radiating, but also stabilization of the standard potential. The standard potential (for example, a ground potential), which is liable to be unstable due to high speed operations of, e.g., high speed CMOS devices, can be supplied from the heat radiating fin 7 through the thermal via 4 to the die pad 2c on which a CMOS device and the like is mounted or its vicinity. As a result, the standard potential can be stabilized.

The above multi-layer wiring substrate of this invention is readily manufactured in the following manner. First, a desired wiring pattern is printed on the surface of an aluminum nitride green sheet using a conductive paste such as W and Mo in a conventional method. Several sheets of such green sheets are piled up and laminated to be subject to sintering at the same time. Prior to this sintering, a hole is formed and filled with, e.g., a conductive paste by so-called via hole means in the aluminum nitride green sheet to form a part of the thermal via such that the thermal via is electrically insulated from the wiring pattern. Thereafter, one, or two or more metals selected from, e.g., Au, Cu, Al, Cr, Ni, Ti, W and Mo are deposited on the main surface of the resultant multi-layer sintering body by vacuum deposition or sputtering method. Patterning is performed by photolithographic method to form the aluminum nitride multi-layer wiring substrate 1.

Next, for example, polyimide resin is spin-coated and prebaked on the surface of the aluminum nitride multi-layer wiring substrate 1. Sequentially, a contact hole is formed in the polyimide resin and then the polyimide resin is cured. Thereafter, for example, Cu or Ni is precipitated by a plating method in the contact hole (a part of the thermal via is formed) to fill the contact hole. The desired signal wiring layer 2b is formed on the surface of the cured polyimide resin layer (interlayer insulating layer) 2a. These sequent processes are repeated to form the thin-film multi-layer wiring part 2 having desired multi-layer wiring layers. As a result, the multi-layer wiring substrate, which have the aluminum nitride multi-layer wiring substrate 1, thin-film multi-layer wiring part 2 and the thermal via 4 arranged through the aluminum nitride multi-layer wiring substrate 1 and thin-film multi-layer wiring part 2, is obtained.

As described above, if the multi-layer wiring substrate according to this invention is used as a wiring substrate on which a device such as high speed CMOS, ECL, or GaAs device is mounted, the good electric properties of a standard thin-film multi-layer wiring part and the good thermal properties (thermal conductivity) of an aluminum nitride ceramic substrate are enhanced. Heat generated by operations of mounted LSI elements and the like is dissipated in extremely low thermal resistance through the thermal via. On the other hand, in electrical view, since the thermal via 4 is connected to the power source wiring layer which is contained in the thin-film multi-layer wiring part and aluminum nitride multi-layer wiring substrate 1, and the heat radiating fin or the like, the standard potential (for example, a ground potential), which is liable to be unstable due to high speed operations of, e.g., high speed CMOS devices, can be supplied to the die pad to be mounted thereon with e.g. a CMOS device or its vicinity. As a result, the standard potential can be readily stabilized. Thus, the multi-layer wiring substrate of this invention is suitable for a device which is expected high speed operations such as a hybrid integrated circuit device of a computer.

The second multi-layer wiring substrate of this invention comprises a ceramic substrate; a multi-layer wiring part formed integrally on the surface of the ceramic substrate where an organic polymer is used as an electric insulating layer; a die pad formed on the surface of the multi-layer wiring part, the die pad suitable for mounting thereon an electronic part; and a column-shaped thermal via being arranged from the die pad to the ceramic substrate in the direction of the thickness of the multi-layer wiring layer, the thermal via being insulated from the wiring; wherein at least one the sectional area of the end portions of the thermal via which contact the ceramic substrate and die pad is larger than the sectional area of the other portion thereof. The above structure can share a part of horizontal heat flow by conduction in the substrate or semiconductive element to heat flow in the thermal via. If the thermal via is made of a material with the thermal conductivity higher than that of the substrate and semiconductive element, thermal resistance due to heat flow in the horizontal direction can be lowered. Further, the thermal via is constructed such that a part of the thermal via is wider, resulting in improvement of the thermal conductive property in the vertical direction within the thermal via, and remarkable improvement of the heat dissipating property of the semiconductive element. Referring to the drawings, they will be explained based on the embodiments below.

Embodiment 3

Figure 4:
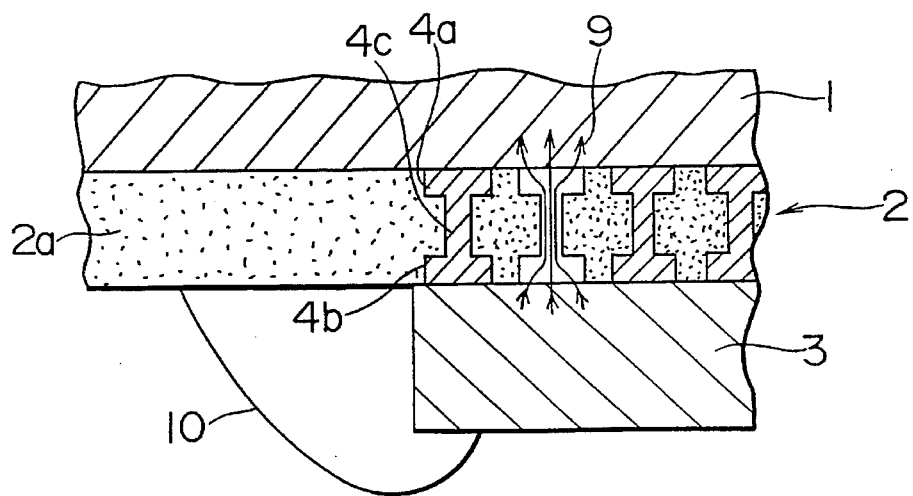
FIG. 4 is a sectional view of a thermal via in a multi-layer wiring substrate according to one embodiment of the present invention.

FIG. 4 is a sectional view of one embodiment according to the invention.

In FIG. 4, a semiconductive element 3, which generates heat, is placed on a wiring layer 2, which contains therein a thermal via 4 formed on the surface of a substrate 1. The main component of the wiring layer 2 is an insulating material 2a such as polyimide resin. Electric wirings (not shown) are formed in the insulating material 2a in a multi-layer structure. The thermal via 4 is arranged in the wiring layer 2 such that the thermal via 4 is not in contact with these wirings.

In the second multi-layer wiring substrate of this invention, as shown in FIG. 4, the thermal via 4 has wide end portions 4a, 4b which contact the substrate 1 and semiconductive element 3 as compared with the other portion (body portion 4c). These wide portions 4a, 4b share a part of heat flow by thermal conduction in the horizontal direction within the semiconductive element 3. In FIG. 4, the flow of heat is shown by an arrow 9.

For example, this thermal via 4 is formed such that the height is 100 μm, the width of the body portion 4c is 50 to 100 μm, and the width of the wide portion 4a or 4b is 60 to 400 μm wider than that of the body portion 4c.

Further, for example, if the thermal via 4 is made of copper, the semiconductive element 3 is made of silicon, and the substrate 1 is made of alumina, the thermal conductive coefficiencies of the thermal via 4, the semiconductive element 3 and the substrate 1 are 350 W/m°C., 150 W/m°C., 20 W/m°C., respectively. Since heat dissipation in the horizontal direction is conducted in the thermal via 4 with the highest thermal conductivity, the thermal resistance becomes substantially smaller as compared with the case where such heat dissipation is conducted in the substrate 1 and semiconductive element 3. Thus, the advantageous effect in the heat dissipating property can be obtained.

The thermal via 4 having the wide portions 4a, 4b thus constructed is manufactured in the following manner.

First, the material of the thermal via 4 such as copper and aluminum is coated with a certain thickness on the substrate 1 by, e.g., sputtering, or plating method. A portion, on which the thermal via 4 is to be formed, is masked; and copper or the like of the other portion is removed by etching process. At this time, the size of the mask is set to be the size of the wide portion 4a of the thermal via 4. Next, the portion where copper or the like is removed by etching is thinly coated with the insulating material 2a. This process is repeated one or more times until the desired thickness of the wide portion 4a is obtained, thus forming the wide portion 4a of the thermal via in the insulating material 2a.

Thereafter, the size of the mask is set to be the size of the body portion 4c. The similar process is repeated one or more times until the necessary thickness is obtained such that the body portion 4c is formed on the wide portion 4a continuously. An electric wiring is also formed in a similar manner to the embodiment 1. Multi-layer wirings are successively formed.

Then, the size of the mask is set to be the size of the wide portion 4b. The wide portion 4b is formed continuously on the body portion 4c, to form the wiring layer 2 having the thermal via 4.

Another manufacture method is shown below.

First, the material of the insulating material 2a such as polyimide is deposited with a desired thickness on the substrate 1, e.g., by sputtering or coating. A portion except for the wide portion 4a is masked, and the insulating material 2a of a portion, on which the thermal via is to be formed, is removed by etching. This concave portion is filled and deposited with a material of the thermal via 4 such as copper and aluminum by, e.g., a sputtering and plating. This process is repeated one or more times until a desired thickness of the wide portion 4a is obtained, to form the wide portion 4a of the thermal via 4 in the insulating material 2a.

Thereafter, the size of a portion which is not masked is set to be the size of the body portion 4c and the similar process is repeated one or more times until a necessary thickness is obtained such that the body portion 4c is formed on the wide portion 4a continuously.

Simultaneously with the above process, an electric wiring is formed in a similar manner to the embodiment 1. Multi-layer wiring is successively formed.

Then, the size of a portion which is not masked is set to be the size of the wide portion 4b, again. The wide portion 4b is formed continuously on the body portion 4c, to form the wiring layer 2 having the thermal via 4.

By the structure of the thermal via in the embodiment 3, a part of heat conduction within the substrate 1 or semiconductive element 3 in the horizontal direction is shared with heat conduction within the wide portions 4a, 4b of the thermal via 4. If the thermal via 4 is made of a material (for example copper or aluminum) with the thermal conductive property higher than that of the substrate 1 (for example alumina or silicon) and that of semiconductive element 3 (for example silicon), increase of the thermal resistance due to heat conduction in the horizontal direction is suppressed. Further, since a part (wide portions 4a, 4b) of the thermal via 4 is wider, the thermal conductive property in the vertical direction within the thermal via 4 is improved, and the heat dissipation property of the semiconductive element 3 is remarkably improved.

The embodiment, where both the end portions of the thermal via 4 are wide, was described above. However, modified embodiments of the other shapes will be described below.

Figure 5:
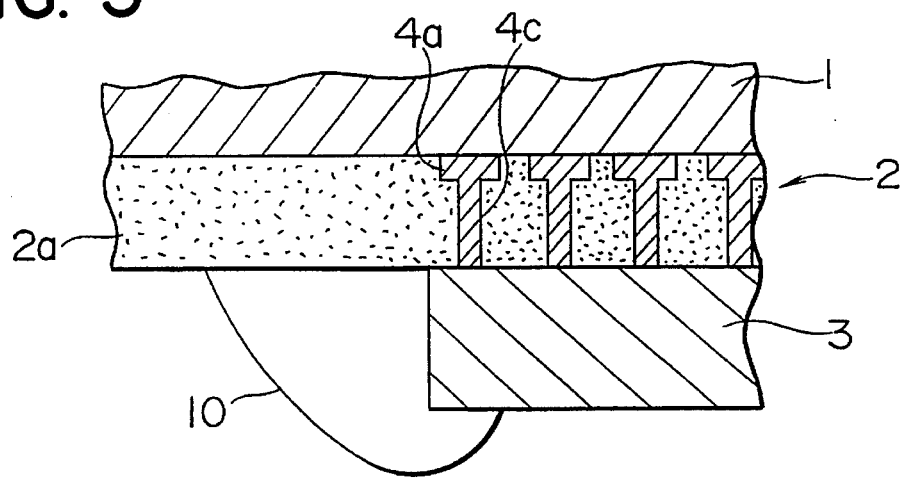
FIG. 5 is a sectional view of a thermal via in a multi-layer wiring substrate according to a still further embodiment of the present invention.

A thermal via 4 shown in FIG. 5 has only a wide portion 4a only in the part which contacts a substrate 1. A part of the heat flow by conduction within the substrate 1 in the horizontal direction is distributed to the wide portion 4a of the thermal via 4 with the high thermal conductivity. As a result, the heat dissipating property in the substrate 1 side is enhanced. Such structure improves the heat dissipating property of a semiconductive element 3 as well.

Figure 6:
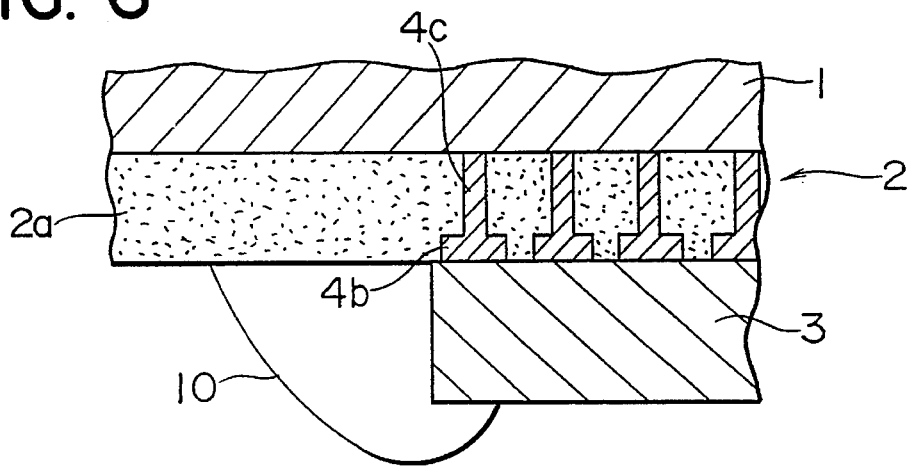
FIG. 6 is a sectional view of a thermal via in a multi-layer wiring substrate according to a still further embodiment of the present invention.

A thermal via 4 shown in FIG. 6 has only a wide portion 4b only in the part which contacts a semiconductive element 3. A part of the heat conductivity within the semiconductive element 3 in the horizontal direction is distributed to the wide portion 4b of the thermal via 4 with the high thermal conductivity. As a result, the heat dissipating property in the semiconductive element 3 side is enhanced. Such structure improves the heat dissipating property of a substrate 1 as well.

Figure 7:
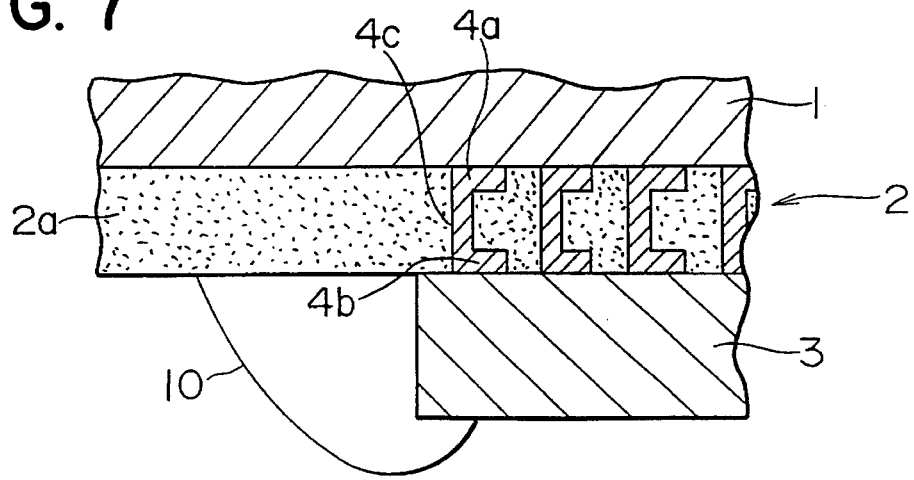
FIG. 7 is a sectional view of a thermal via in a multi-layer wiring substrate according to a still further embodiment of the present invention.
Figure 8:
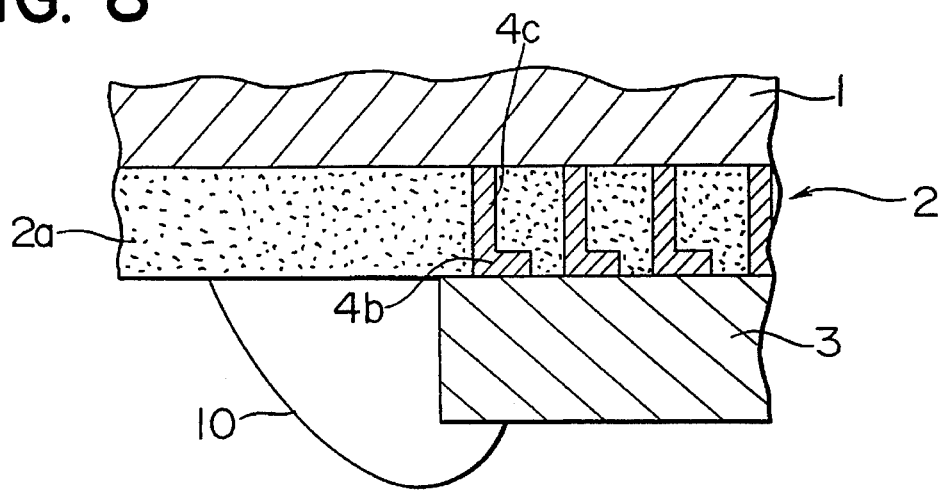
FIG. 8 is a sectional view of a thermal via in a multi-layer wiring substrate according to a still further embodiment of the present invention.

A thermal via 4 shown in FIG. 7 is shaped like "]" to form wide portions 4a, 4b. A thermal via 4 shown in FIG. 8 is shaped like the letter "L" to form only wide portion 4b. As a modified embodiment of FIG. 8 (not shown), a thermal via 4 may be shaped like the letter "L" to form only wide portion 4a. These embodiments have similar functions and effects.

Figure 9:
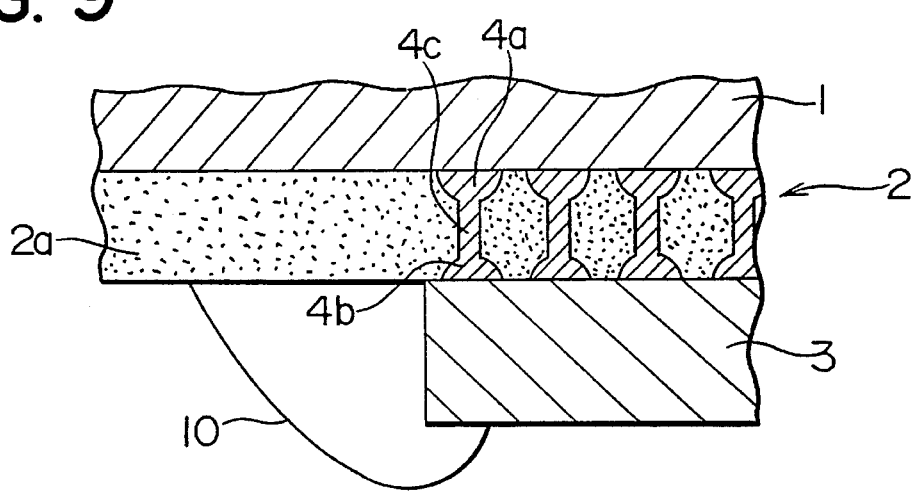
FIG. 9 is a sectional view of a thermal via in a multi-layer wiring substrate according to a still further embodiment of the present invention.

As shown in FIG. 9, the widths of wide portions 4a, 4b may be gradually changed with a taper. In this case, one of such wide portions 4a, 4b may be formed corresponding to FIGS. 5, and 6. Further, such wide portion 4a or 4b may be formed in the shape of the letter "]" or "L" corresponding to FIGS. 7, and 8. These embodiments also have similar functions and effects.

In the present invention, a thermal via 4 and electric wiring are formed in a wiring layer 2. The other active mounted parts such as a transistor, diode, and semiconductive element (for example, IC) may be buried. Although the thermal via 4 of the invention is provided for transferring heat, the thermal via may have further the function of transferring electricity.

Although in the above embodiments as shown in FIGS. 4 to 9, the semiconductive element 3 is mounted by a bonding wire 10, it may be mounted by the other mounted method such as a flip chip.

Next, referring to FIGS. 10 and 11, the third multi-layer wiring substrate of the invention will be described.

The third multi-layer wiring substrate of this invention comprises a ceramic substrate 1; a multi-layer wiring part 2 formed integrally on the surface of the ceramic substrate 1 where an organic polymer is used as an electric insulating layer; a die pad 2C formed on the surface of the multi-layer wiring part, the die pad being used in mounting an electronic part; and a column-shaped thermal via 4 being arranged from the die pad 2C to the ceramic substrate 1 in the direction of the thickness of the multi-layer wiring layer, the thermal via being electrically insulated from them; wherein the sectional areas of the end portions of the thermal via 4 which contact the ceramic substrate 1 or die pad 2C are larger than the sectional area of the other portion of the thermal via 4; and the sectional areas of the end portions of the thermal via 4 satisfy the following equation;

$$0.045 < A^* \leq 0.19h^* + 0.34$$
$$A^* = (d/D)^2$$
$$h^* = h/d$$

$$h = \frac{h}{2} \frac{(d_{av})^2 - d^2}{(d_e)^2 - d^2}$$

wherein
- d: when a square, which has the same area as the sectional area of the smallest portions of the thermal via 4, is assumed, d is the length of one side of the square.
- $d_e$: when a square, which has the same area as the area of the end portion of the thermal via 4 contacting the die pad 2c or substrate 1, is assumed, $d_e$ is the length of one side of the square.
- $d_{av}$: when a square, which has the same area as the average area of the sectional portions of the thermal via 4, is assumed, day is the length of one side of the square.
- D: the average pitch of the thermal via under the die pad 2c
- L: the length of the thermal via 4

Figure 10:
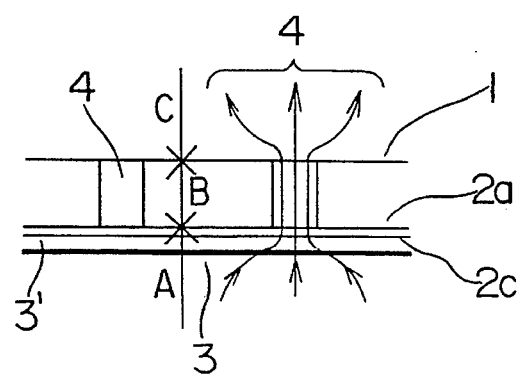
FIG. 10 is a view illustrating a heat flow when a thermal via, whose the sectional areas are the same, is used in a multi-layer wiring substrate according to the present invention.

As shown in FIG. 10, in the case where the width of the thermal via 4 is constant, the flow of heat, which passes through the thermal via 4, is reduced in the region A before the wiring layer region B, and enlarged in the region C after the wiring layer region B. The thermal resistance between the front and back of the wiring layer 2 can be separated into the thermal resistance Rv in the region B and the thermal resistance Re generated and accompanied with the reduction and enlargement of the heat flow in the regions A and C. Re does not contain the component of the thermal resistance accompanied with the heat flow in the vertical direction of FIG. 10. Re is the thermal resistance extracting only component relating to heat movement in the horizontal direction. The enlargement of the end portion of the thermal via 4 is effective in reducing mainly Re.

Figure 11:
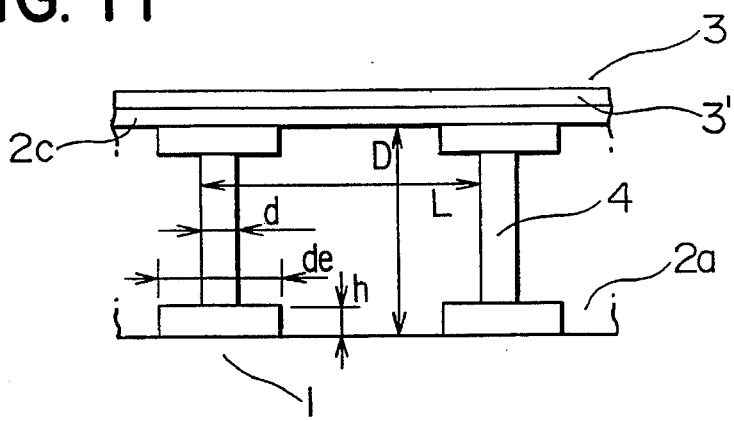
FIG. 11 is a sectional view illustrating an analysis model of a multi-layer wiring substrate with a thermal via whose the sectional areas of the end portions are wide.

As shown in FIG. 11, in the case where both the end portions of the thermal via 4 are enlarged, the amount of the thermal resistance is reduced due to the enlargement of the end portions. Re is the thermal resistance when neither of the end portions are enlarged. If Re is used as a standard, the dimentionless thermal resistance reduction amount $\Delta R^*$ is defined by the following equation:

$$\Delta R^* = \frac{(Re)_{de=d} - Re}{(Re)_{de=d}}$$

wherein $(Re)_{de=d}$ is the thermal resistance due to the reduction and enlargement of the heat flow in the thermal via 4 which does not have a wide end portion, namely de=d.

Figure 12:
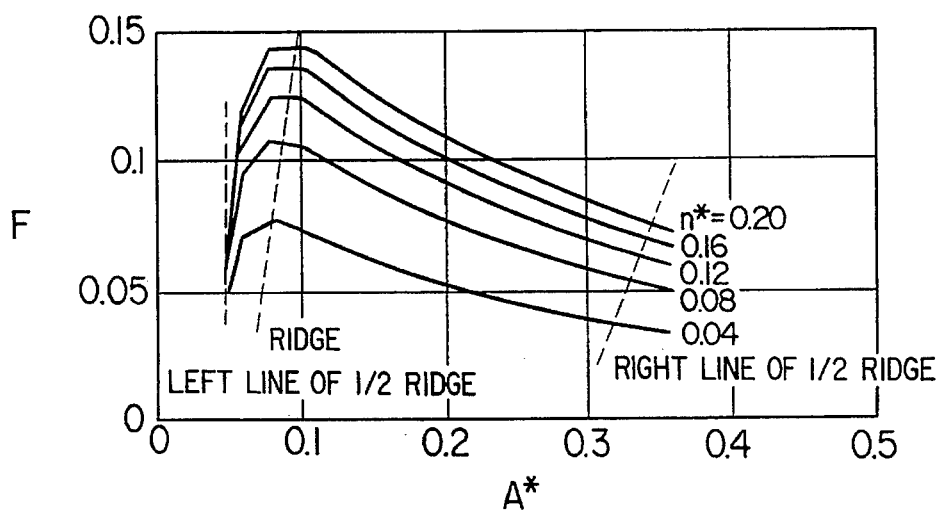
FIG. 12 is a diagram illustrating a valuation function by a numerical analysis using the analysis model as shown in FIG. 11.

The evaluating function, $F=\Delta R^*/A^*$, will be now considered. $A^*$ is the ratio of the thermal via area to all the area under a chip. For example, when thermal vias are arranged like a lattice at a pitch D, $A^*=(de/D)^2$. FIG. 12 shows results of calculating F by numerical analysis. If with respect to F, half of the peak value of the heights $h^*$ of the various wide end portions is allowable, the relation, 0.045 < A* < 0.19h* + 0.34 wherein h=h/d,
is obtained. At the left limitation value, 0.045, in the above equation, the gradient of the graph is large, the dependency of h* is small, and the value is considered to be almost constant.

According to the invention, a part of reduction or enlargement of the heat flow inside the substrate 1, semiconductive element 3 or the like can be conducted inside the thermal via 4. Since the thermal via 4 is made of a material with the high thermal conductivity, the thermal resistance accompanied with the reduction or enlargement of the heat flow can be reduced. Further, since a part of the thermal via is wide, the thermal resistance inside the thermal via 4 in the direction vertical to the substrate 1 can be reduced as well.

Embodiment 4

Figure 13:
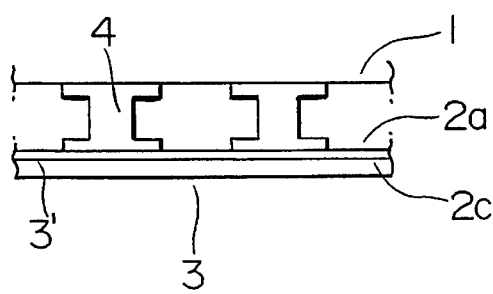
FIG. 13 is a view illustrating an embodiment of a multi-layer wiring substrate with a thermal via whose the sectional areas of the end portions are wide as shown in FIG. 11.

Referring to FIGS. 11 and 13, the embodiment will be described. FIG. 13 is a sectional view of the embodiment according to the present invention. A semiconductive element 3 generating heat is mounted by a mounting material 3' on a die pad 2c disposed on the surface of a wiring layer 2 holding a thermal via 4. The two or one end portions of the thermal via 4 is enlarged. The enlarged end portion is shared the thermal resistance due to reduction and enlargement of heat flow inside the substrate 1, semiconductive element 3 or the like.

For example, the thermal via 4 is made of copper, the length thereof is 100 μm (L=100 μm), the shape thereof is a square column where a side of the square is 50 μm (d=50 μm), and such thermal vias are arranged at a pitch 250 μm (D=250 μm). The wiring layer 2, where that an insulator 2a is polyimide, is formed on the substrate 1 made of aluminum nitride. In such case, the regions with the height of 10 μm (h=10 μm) of the both end portions of the thermal via 4 is enlarged to form a square column where a side of the square is 80 μm (de=80 μm). As a result, the thermal resistance Re accompanied with heat reduction or enlargement is reduced to 0.4 times.

As mentioned above, according to the invention, a wiring layer with the small thermal resistance can be obtained and the heat of a semiconductive element can be sufficiently transferred to a substrate. This enables sufficient heat dissipation even when a super high speed element such as a CMOS, which generates the great amount of heat, is mounted. As a result, a multi-layer wiring substrate with the excellent electric property and thermal property can be obtained.

What is claimed is:

1. A multi-layer wiring substrate comprising:

a ceramic substrate;

a wiring layer comprising a wiring formed in an electrical insulating material, the wiring layer being integrally formed on the ceramic substrate;

a die pad for mounting thereon an electronic part, the die pad being provided on a surface of the wiring layer; and a thermal via of a column shape for transferring heat, the thermal via being provided in the wiring layer so as to pass through at least the wiring layer in a direction of a wiring layer thickness and contact the ceramic substrate and the die pad;

wherein a sectional area of an end portion of the thermal via is larger than an average sectional area, and satisfy the following equation:

0.045 < A* < 0.19h* + 0.34
A* = (d_e/D)^2
h* = h/d $$h = \frac{L}{2} \frac{(d_{av})^2 - d^2}{(d_e)^2 - d^2}$$

wherein
d: when a square, which has the same area as the sectional area of the smallest portions of the thermal via, is assumed, d is the length of one side of the square;

$d_e$: when a square, which has the same area as the sectional area of the end portion of the thermal via contacting the die pad or substrate, is assumed, $d_e$ is the length of one side of the square;

$d_{av}$: when a square, which has the same area as the average area of the sectional portions of the thermal via, is assumed, $d_{av}$ is the length of one side of the square;

D: the average pitch of the thermal via contacting the die pad;

L: the length of the thermal via; and h: the length of the portion of the thermal via having $d_e$.

2. The multi-layer wiring substrate of claim 1, wherein the ceramic substrate is an aluminum nitride substrate.

3. The multi-layer wiring substrate of claim 1, wherein the electric insulative material is polyimide resin.

4. The multi-layer wiring substrate of claim 1, wherein the multi-layer wiring substrate further comprises a heat radiating fin being provided on a surface of the ceramic substrate opposite to the surface on which the wiring layer is formed 5. The multi-layer wiring substrate of claim 1, wherein all the area of a part where the thermal via contacts the surface of the die pad is preferably ranged from about 5 to 20% of all the area of the die pad surface.

6. The multi-layer wiring substrate of claim 1, wherein the thermal via is electrically insulated from the thin-film multi-layer wiring part.

7. The multi-layer substrate of claim 1, wherein a longitudinal section of the thermal via is shaped like "]".

8. The multi-layer wiring substrate of claim 1, wherein a longitudinal section of the thermal via is shaped like a letter "L".

9. The multi-layer wiring substrate of claim 1, wherein a longitudinal section of the thermal via is gradually reduced in a direction from the end portion to a center portion.

10. The multi-layer wiring substrate of claim 9, wherein a sectional area of at least one of end portions of the thermal via is larger than an average sectional area of the other portion of the thermal via.

11. A multi-layer wiring substrate comprising:

a ceramic multi-layer wiring substrate having an electric insulating layer of aluminum nitride;

a thin-film multi-layer wiring part having an electric insulating layer of an organic polymer, the thin-film multi-layer wiring part being integrally formed on a first surface of the ceramic multi-layer wiring substrate;

a die pad for mounting thereon an electronic part, the die pad being provided on a surface of the thin-film multi-layer wiring part; and at least one thermal via, one end of the thermal via being connected to the die pad, the other end of the thermal via passing through the thin-film multi-layer wiring part and extending to at least the first surface of the ceramic multi-layer wiring substrate;

wherein the thermal via is electrically insulated from the thin-film multi-layer wiring part.

* * * * *